(12) United States Patent
Daniel

(10) Patent No.: US 7,280,000 B2
(45) Date of Patent: Oct. 9, 2007

(54) APPARATUS AND METHOD FOR REDUCING POWER CONSUMPTION WITHIN AN OSCILLATOR

(75) Inventor: Alan Daniel, Durham, NC (US)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 11/122,016

(22) Filed: May 5, 2005

(65) Prior Publication Data

US 2006/0250191 A1 Nov. 9, 2006

(51) Int. Cl.
*H03K 3/02* (2006.01)

(52) U.S. Cl. .................. 331/143; 331/111; 331/74; 323/268

(58) Field of Classification Search ........... 331/111, 331/143, 74; 323/268
See application file for complete search history.

(56) References Cited

U.S. PATENT DOCUMENTS

| | | | |
|---|---|---|---|
| 5,345,195 A | 9/1994 | Cordoba et al. | |
| 5,461,590 A | 10/1995 | Cordoba et al. | |
| 6,031,407 A | 2/2000 | Cordoba et al. | |
| 6,188,293 B1 | 2/2001 | Miyagi et al. | |
| 6,329,884 B1 | 12/2001 | Tsukagoshi et al. | |
| 6,781,356 B1 | 8/2004 | Yang et al. | |
| 6,803,832 B2 | 10/2004 | Pigott | |
| 6,838,952 B2 | 1/2005 | Ramet | |
| 7,106,130 B2 * | 9/2006 | Gan et al. | 330/10 |

\* cited by examiner

*Primary Examiner*—Arnold Kinkead
(74) *Attorney, Agent, or Firm*—Edell, Shapiro & Finnan LLC

(57) ABSTRACT

An oscillator according to the present invention reduces power consumption by enlarging the pulsewidth of an oscillator output pulse. Since this pulse disables an oscillator current source, the enlarged pulsewidth reduces the time the current source is enabled. When a first capacitor charges to at least a reference voltage, a differential amplifier produces a low level signal that is provided to a latch generating the output pulse. The low level signal controls the latch to produce and maintain a high level signal until the latch is triggered. The latch signal disables the current source, while enabling a transistor to transfer charge from the first capacitor to a second capacitor. When the second capacitor attains a sufficient voltage, the latch is triggered to produce a low level signal, thereby enlarging the pulsewidth of the output pulse. The low level signal enables the current source and facilitates discharge of the second capacitor.

15 Claims, 4 Drawing Sheets

APPARATUS AND METHOD FOR REDUCING POWER CONSUMPTION WITHIN AN OSCILLATOR

BACKGROUND OF THE INVENTION

1. Technical Field

The present invention pertains to oscillators. In particular, the present invention pertains to an oscillator with circuitry to increase the pulsewidth of an oscillator output pulse. Since the output pulse disables an oscillator current source, the increased pulsewidth of that pulse lengthens the time interval the current source maintains a disabled state, thereby reducing oscillator power consumption.

2. Discussion of Related Art

Nearly all electronic instruments employ some type of oscillator or waveform generator. A source of regular oscillation is necessary in any cyclical measuring device, such as one involving periodic states or waveforms. An oscillator may be used to provide a source of regularly spaced pulses or may be employed for stability and accuracy of resulting waveforms depending upon an application.

Although oscillators are a necessary component of any electronic device, oscillators consume significant amounts of power in various applications. This may be disadvantageous since power consumption has become a prominent consideration in most modern electronic devices, especially portable devices such as laptops, portable telephones, and personal data assistants.

In a typical oscillator, a current source is conducting during intervals between output pulses, where the output pulses are generally of short duration. Therefore, the oscillator is constantly consuming power for a majority of the time the oscillator is operating, thereby limiting the battery life of any handheld or portable devices that employ these types of oscillators. A conventional oscillator consuming power in this fashion is illustrated in FIG. 1. Specifically, a conventional oscillator 10 includes a current source 15, a capacitor 20 and a differential amplifier 30. The capacitor is disposed between current source 15 and a ground potential. Differential amplifier 30 includes a conventional configuration including a pair of n-channel field effect transistors (NFET) 22, 32 and a pair of p-channel field effect transistors (PFET) 24, 34. The sources of NFETs 22, 32 are tied together with a current source 23 disposed between the tied sources and a ground potential. The gates of PFETs 24, 34 are tied together and coupled to the drain of PFET 34. The drains of NFETs 22, 32 are respectively coupled to the drains of PFETs 24, 34. The gate of NFET 22 serves as the inverting input of the differential amplifier, while the gate of NFET 32 serves as the amplifier non-inverting input. The drain of NFET 22 provides the amplifier output. The differential amplifier basically produces a difference signal on the amplifier output representing the difference between signals provided to the non-inverting and inverting inputs.

The amplifier inverting input receives voltage from capacitor 20 (e.g., CAP as viewed in FIG. 1) and is coupled to a junction between the capacitor and current source 15. The amplifier non-inverting input is coupled to a reference voltage 60. Capacitor 20 receives current from current source 15 and charges accordingly. When the reference voltage exceeds the capacitor voltage, differential amplifier 30 produces a high level (e.g., positive potential) signal on the amplifier output. However, a low level (e.g., zero or negative potential) signal is produced by the differential amplifier in response to the capacitor voltage attaining at least the reference voltage. The amplifier output basically represents the difference between the capacitor and reference voltages. The output of differential amplifier 30 is coupled to a pair of transistors, PFET 55 and NFET 35, that control the output pulse of oscillator 10. In particular, the amplifier output is coupled to the gate of PFET 55, where the transistor source is tied to a ground potential and the transistor drain is tied to a drain of NFET 35. The source of NFET 35 is tied to a ground potential, while the transistor gate is coupled to reference voltage 60. PFET 55 drives the amplifier output signal, while NFET 35 controls the rate the pulse is pulled low as described below.

An inverter 40 is coupled to the junction between the drain of PFET 55 and the drain of NFET 35. The output of inverter 40 provides a signal to disable the current source during the output pulse as described below and is coupled to a subsequent inverter 45 that produces the oscillator output pulse (e.g., OUT as viewed in FIG. 1). Inverters 40 and 45 provide the oscillator output at a sufficient voltage to drive external circuitry, while providing the proper logic to maintain consistency between the logic states of the signal produced by transistors 35, 55 and the oscillator output signals.

An inverter 65 is disposed within a feedback path and is coupled to the output of inverter 40. Inverter 65 produces a high level signal in response to an oscillator output pulse (e.g., inverter 40 produces a low level signal in response to the oscillator output pulse which is inverted by inverter 65) to disable current source 15 during that pulse. The output of inverter 65 is coupled to a gate of an NFET 25. The NFET drain is coupled to the inverting input of differential amplifier 30, while the NFET source is tied to a ground potential. NFET 25 facilitates the discharge of capacitor 20 in response to the oscillator output pulse, thereby initiating a subsequent oscillator cycle to produce a successive pulse. A PFET 50 is disposed in the feedback path with the transistor gate coupled between inverters 40 and 65, the transistor source tied to a ground potential and the transistor drain coupled to the differential amplifier output. PFET 50 is enabled during an output pulse to disable PFET 55 and enable the pulse to be pulled low.

Operation of oscillator 10 is described with reference to FIGS. 1-2. Initially, capacitor 20 is discharged and provides a low level signal to the inverting input of differential amplifier 30 (e.g., CAP as viewed in FIGS. 1-2). Since the reference voltage provided to the amplifier non-inverting input exceeds the capacitor voltage, the differential amplifier produces a high level signal. This signal disables PFET 55, thereby producing a low level signal for the input of inverter 40. Inverter 40 inverts the low level signal and produces a high level signal for the feedback path and inverter 45. Inverter 45 inverts the high level signal and provides a low level signal as the oscillator output (e.g., OUT as viewed in FIGS. 1-2). The high level signal from inverter 40 traverses the feedback path and disables PFET 50. The signal is further received and inverted by inverter 65 to produce a low level signal that allows current source 15 to enter and/or maintain an enabled state and disables NFET 25, thereby enabling capacitor 20 to charge.

Current source 15 in an enabled state provides current to charge capacitor 20 as illustrated in FIG. 2. The oscillator operates as described above until the capacitor charges to at least the reference voltage. Once this occurs, the differential amplifier produces a low level signal that enables PFET 55. The combination of PFET 55 and NFET 35 produce an output pulse that is amplified by inverters 40 and 45 to form the oscillator output. This output pulse typically has a short duration (e.g., one to two percent of the oscillator period) as illustrated in FIG. 2. Since the output pulse is inverted by a pair of inverters, the resulting oscillator output logic level is equivalent to the logic level of the initial output pulse produced by the combination of transistors 35, 55.

Inverter 40 inverts the initial output pulse to provide a low level signal along the feedback path. The low level signal enables PFET 50 to disable PFET 55 and allow the signal generated by PFET 55 and NFET 35 to be pulled low. Inverter 65 inverts the low level signal to produce a high level signal that disables current source 15 during the output pulse and enables NFET 25 to discharge capacitor 20 as illustrated in FIG. 2.

Once the capacitor voltage falls below the reference voltage (e.g., due to the discharge), differential amplifier 30 produces a high level signal as described above. Subsequently, the output produced by the combination of transistors 35, 55 returns to a low level and inverters 40 and 45 produce a low level oscillator output as described above. Inverter 40 inverts the low level output signal and generates a high level signal along the feedback path that disables PFET 50. Inverter 65 receives the high level signal and produces a low level signal that enables the current source and disables NFET 25 to permit capacitor 20 to charge. The enabled current source charges the capacitor to produce a subsequent oscillator output pulse as described above. Thus, since current source 15 of oscillator 10 is disabled during the small time interval corresponding to the output pulsewidth, the current source is enabled virtually the entire time the oscillator is operating, thereby consuming a significant amount of power.

SUMMARY OF THE INVENTION

According to the present invention, an oscillator reduces power consumption by enlarging the pulsewidth of an oscillator output pulse. Since this pulse disables an oscillator current source, the enlarged pulsewidth reduces the time interval the current source is in an enabled state. The oscillator output pulse is generated by a differential amplifier producing a difference signal between a reference voltage and the voltage of a first capacitor coupled to the current source. When the first capacitor charges to a voltage level of at least the reference voltage, the differential amplifier produces a low level signal that is provided to an input of a latch. The latch receives the low level signal and produces and maintains a high level signal until the latch is triggered as described below. The high level latch signal traverses a feedback path and disables the current source, while enabling a transistor to transfer charge from the first capacitor to a second capacitor. When the second capacitor attains a sufficient voltage to drive an associated inverter, the inverter triggers the latch to produce a low level signal. Thus, the charging of the second capacitor enlarges the pulsewidth of the oscillator output pulse. The latch low level signal traverses the feedback path to enable the current source and a second transistor facilitating discharge of the second capacitor. The cycle is repeated to produce a subsequent output pulse.

The present invention provides several advantages. In particular, the oscillator current source is disabled for a greater quantity of time, thereby reducing power consumption. In addition, since the second capacitor receives charge from the first capacitor, the second capacitor is charged without additional power sources, thereby further reducing power consumption of the oscillator.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 3:
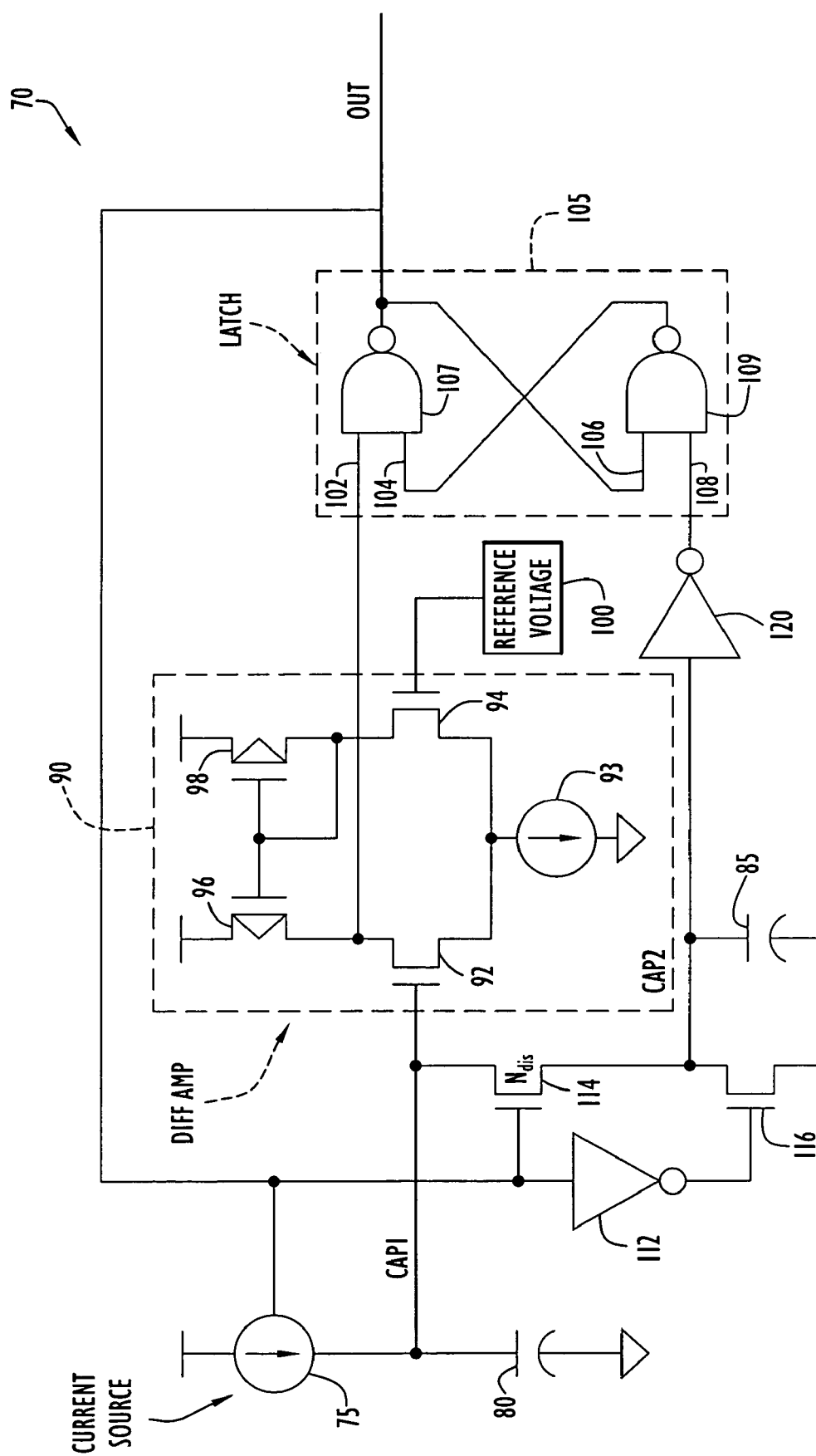
FIG. 3 is an electrical schematic diagram of an oscillator with reduced power consumption according to the present invention.

An oscillator with reduced power consumption according to the present invention is illustrated in FIG. 3. Specifically, oscillator 70 includes a current source 75, a pair of capacitors 80, 85, a differential amplifier 90 and a latch 105. Capacitor 80 is disposed between current source 75 and a ground potential. Differential amplifier 90 includes a conventional configuration including a pair of n-channel field effect transistors (NFET) 92, 94 and a pair of p-channel field effect transistors (PFET) 96, 98. The sources of NFETs 92, 94 are tied together with a current source 93 disposed between the tied sources and a ground potential. The gates of PFETs 96, 98 are tied together and coupled to the drain of PFET 98. The drains of NFETs 92, 94 are respectively coupled to the sources of PFETs 96, 98. The gate of NFET 92 serves as the inverting input of the differential amplifier, while the gate of NFET 94 serves as the amplifier non-inverting input. The drain of NFET 92 provides the amplifier output. The differential amplifier basically produces a difference signal on the amplifier output representing the difference between signals provided to the non-inverting and inverting inputs.

The amplifier inverting input receives a voltage from capacitor 80 (e.g., CAP1 as viewed in FIG. 3) and is coupled to a junction between capacitor 80 and current source 75. The amplifier non-inverting input is coupled to a reference voltage 100. Capacitor 80 receives current from current source 75 and charges accordingly. When the reference voltage exceeds the capacitor voltage, differential amplifier 90 produces a high level (e.g., positive potential) signal on the amplifier output. However, a low level (e.g., zero or negative potential) signal is produced by the differential amplifier in response to the capacitor voltage attaining at least the reference voltage. The amplifier output basically represents the difference between the capacitor and reference voltages.

The output of differential amplifier 90 is coupled to latch 105 that controls the output pulse of oscillator 70. In particular, the latch includes NAND gates 107, 109. NAND gate 107 includes an input 102 serving as a first latch input and an input 104. NAND gate 109 includes an input 106 and an input 108 serving as a second latch input. Input 104 of NAND gate 107 is coupled to the output of NAND gate 109, while the output of NAND gate 107 is coupled to input 106 of NAND gate 109. Thus, the NAND gates are arranged to receive feedback in a manner similar to conventional memory elements (e.g., an R-S type flip-flop triggered by negative or low level signals). When the differential amplifier produces a low level signal in response to charging of capacitor 80 as described above, the latch produces and maintains a high level signal representing the oscillator output pulse. The high level signal is maintained until the latch is triggered as described below, thereby enabling the latch to control the pulsewidth of the output pulse.

The latch output is provided to a feedback path to disable current source 75 in response to and during the output pulse. An inverter 112 is disposed along the feedback path with the inverter output coupled to a gate of an NFET 116, where the source of NFET 116 is coupled to a ground potential. An NFET 114 includes a gate coupled to the feedback path between latch 105 and inverter 112, a drain coupled to the inverting input of differential amplifier 90 and a source coupled to the drain of NFET 116. Capacitor 85 is disposed between the drain of NFET 116 and a ground potential, while the drain of NFET 116 is further coupled to an inverter 120 with an output coupled to latch 105. NFET 114 enables transfer of charge from capacitor 80 to capacitor 85 during an output pulse, where the voltage of capacitor 85 (e.g., CAP2 as viewed in FIG. 3) enables triggering of latch 105 to control the output pulsewidth as described below. NFET 116 facilitates discharge of capacitor 85 at the termination of an output pulse as described below.

Operation of oscillator 70 is described with reference to FIGS. 3-4. Initially, capacitor 80 is discharged and provides a low level signal to the inverting input of differential amplifier 90. Since the reference voltage provided to the amplifier non-inverting input exceeds the voltage of capacitor 80 (e.g., CAP1 as viewed in FIGS. 3-4), the differential amplifier produces a high level signal that is provided to latch 105. The oscillator further initially produces a low output pulse (e.g., OUT as viewed in FIGS. 3-4) that traverses the feedback path to enable NFET 116 via inverter 112 as described above, thereby maintaining capacitor 85 in a discharged state. The signal from capacitor 85 (e.g., CAP2 as viewed in FIGS. 3-4) is inverted by inverter 120 to provide a high level signal to latch 105.

A truth table for latch 105 is illustrated in Table I below, where '0' represents low level signals and '1' represents high level signals. Latch 105 receives the high level signal from differential amplifier 90 on latch input 102 (of NAND gate 107), and further receives the high level signal from inverter 120 on latch input 108 (of NAND gate 109). The latch produces a low level signal in response to these inputs as indicated in Table I below. In particular, NAND gate 109 produces a high level signal based on the low level oscillator output signal provided to NAND gate input 106 and the high level signal from inverter 120 provided to NAND gate input 108. The high level signal from NAND gate 109 is provided to input 104 of NAND gate 107. NAND gate 107 produces a low level signal as the oscillator output pulse based on the high level amplifier signal provided to NAND gate input 102 and the high level output signal from NAND gate 109 provided to NAND gate input 104.

TABLE I

| Latch Input (NAND Gate Input 102) | Latch Input (NAND Gate Input 108) | Latch Output |
|---|---|---|
| 0 | 1 | 1 |
| 1 | 0 | 0 |
| 1 | 1 | Maintains Current State |

The low level output signal from latch 105 traverses the feedback path and allows current source 75 to enter and/or maintain an enabled state and disables NFET 114, thereby enabling capacitor 80 to charge. Inverter 112 inverts the low level feedback signal and enables NFET 116, thereby maintaining capacitor 85 in a discharged state.

Figure 4:
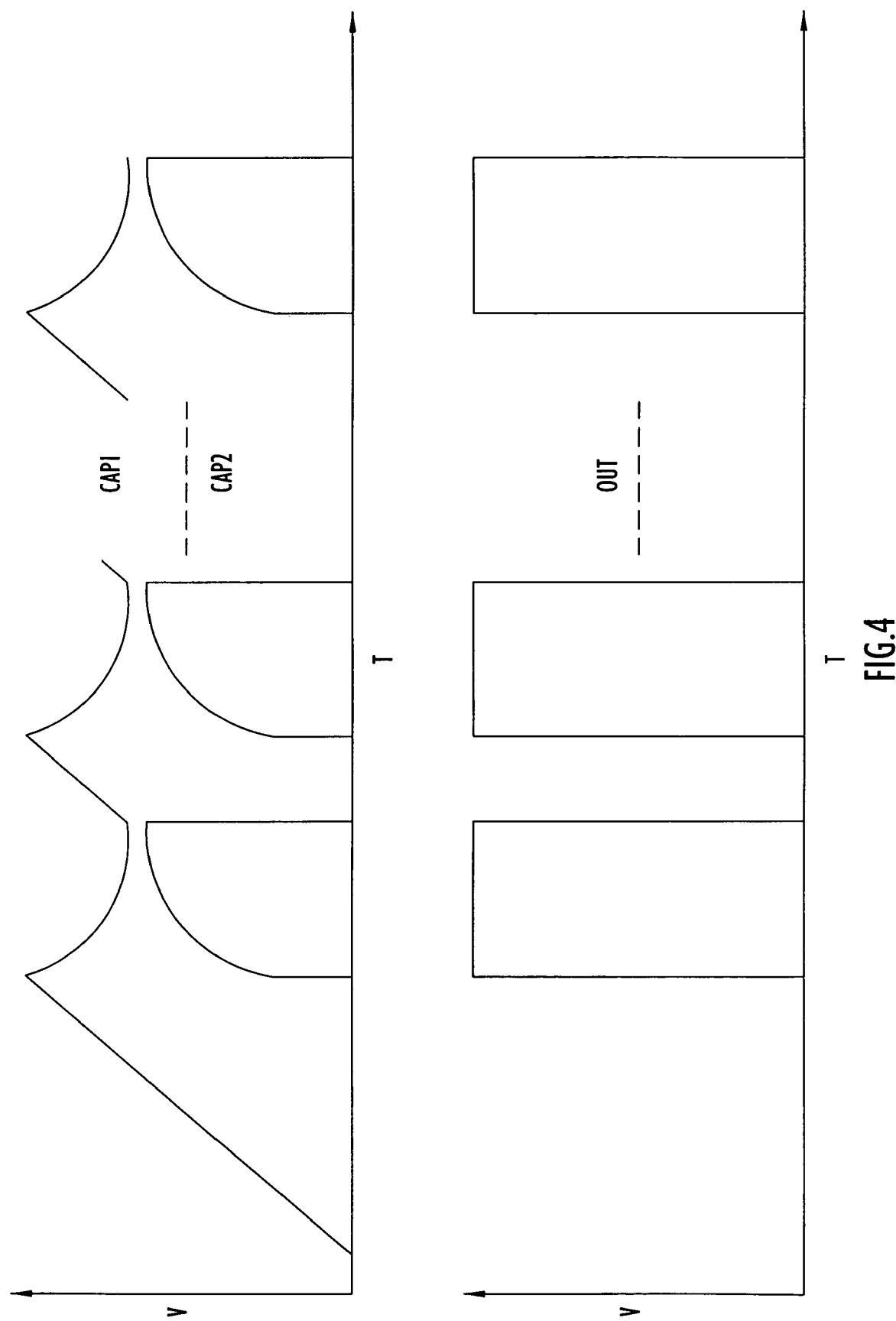
FIG. 4 is graphical illustrations of timing diagrams of capacitor voltages and an oscillator output pulse of the oscillator of FIG. 3.

Current source 75 in an enabled state provides current to charge capacitor 80 as illustrated in FIG. 4. The oscillator operates as described above until capacitor 80 charges to at least the reference voltage. Once this occurs, the differential amplifier produces a low level signal that is provided to latch input 102 (of NAND gate 107). Capacitor 85 in a discharged state provides a low level signal that is inverted by inverter 120 to a high level signal and provided to latch input 108 (of NAND gate 109). The latch receives the low level and high level signals on inputs 102, 108, respectively, and produces a high level signal as the oscillator output as indicated in Table I above. In particular, NAND gate 109 produces a high level signal based on the low level oscillator output signal provided from NAND gate 107 to NAND gate input 106 and the high level signal provided from inverter 120 to NAND gate input 108. NAND gate 107 produces the high level oscillator output signal based on the high level signal from NAND gate 109 provided to NAND gate input 104 and the low level signal from the differential amplifier provided to NAND gate input 102.

The high level output signal traverses the feedback path and disables current source 75 during the output pulse and enables NFET 114 to transfer charge from capacitor 80 to capacitor 85 as illustrated in FIG. 4. Inverter 112 inverts the high level feedback signal and disables NFET 116, thereby enabling capacitor 85 to charge. During charging of capacitor 85 to a threshold voltage of inverter 120 (e.g., a threshold voltage of an inverter NFET), capacitor 80 discharges to a voltage below the reference voltage (FIG. 4). Accordingly, differential amplifier 90 produces a high level signal that is provided to latch input 102 (of NAND gate 107) as described above, while inverter 120 produces a high level signal for latch input 108 (of NAND gate 109) since capacitor 85 has not exceeded the threshold voltage. Latch 105 maintains the high level output signal based on the high level signals provided to the latch inputs as indicated in Table I above. In particular, NAND gate 109 produces a low level signal based on the high level oscillator output signal (or output of NAND gate 107) provided to NAND gate input 106 and the high level signal provided to NAND gate input 108 from inverter 120 inverting the low level signal from capacitor 85 (e.g., since capacitor 85 has not yet reached the threshold voltage). NAND gate 107 maintains the high level oscillator output signal based on the low level signal from NAND gate 109 provided to NAND gate input 104 and the high level signal from differential amplifier 90 provided to NAND gate input 102.

When capacitor 85 attains a voltage exceeding the threshold voltage for inverter 120, the inverter provides a low level signal to latch input 108 (of NAND gate 109), while latch input 102 (of NAND gate 107) receives the high level signal from differential amplifier 90. This toggles latch 105 to produce a low level output as indicated in Table I above. In particular, NAND gate 109 produces a high level signal based on the high level oscillator output signal from NAND gate 107 provided to NAND gate input 106 and the low level signal provided to NAND gate input 108 from inverter 120. NAND gate 107 produces a low level signal as the oscillator output based on the high level signal provided to NAND gate input 102 from differential amplifier 90 and the high level signal from NAND gate 109 provided to NAND gate input 104.

Figure 1:
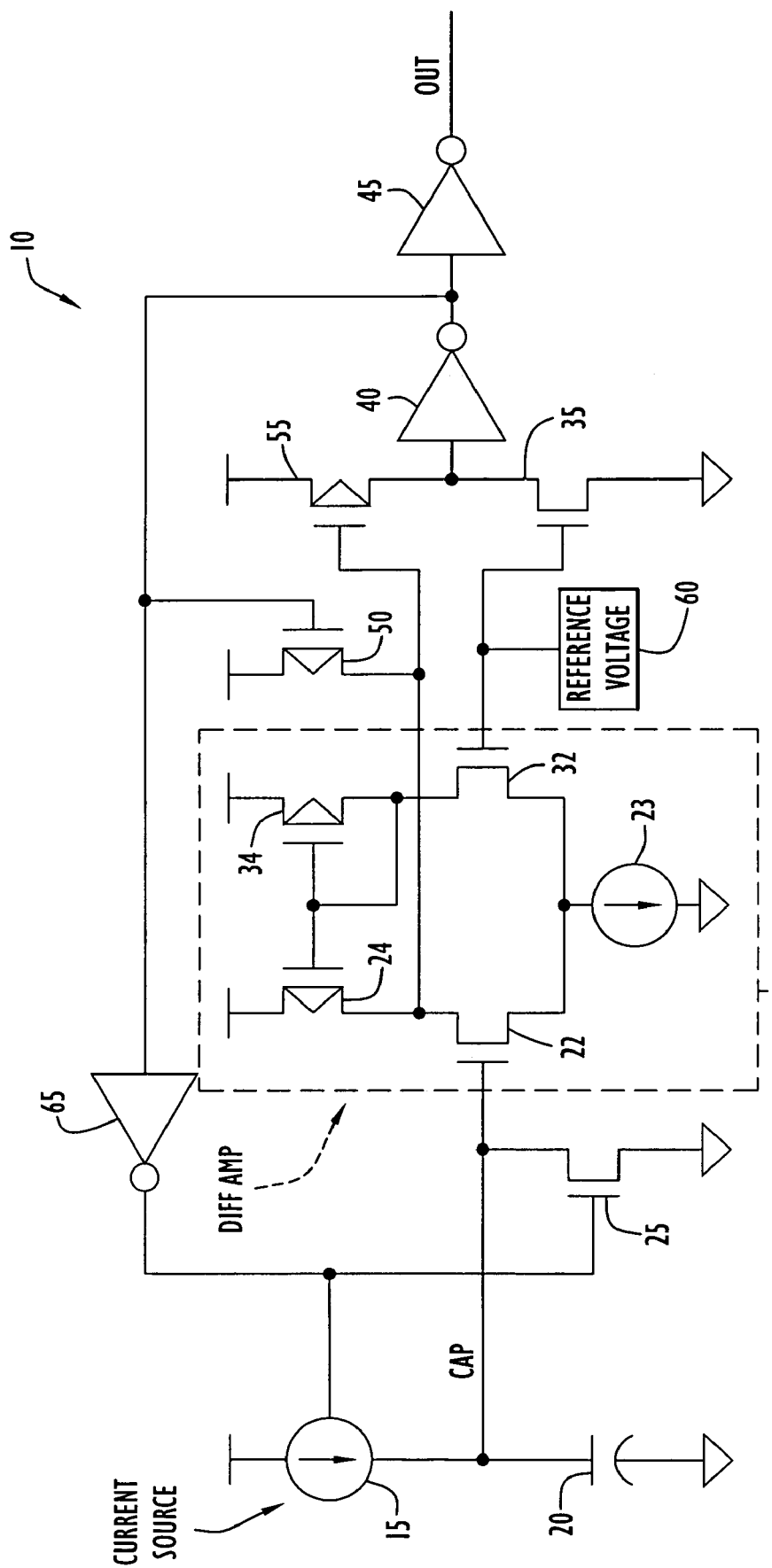
FIG. 1 is an electrical schematic diagram of a conventional oscillator.
Figure 2:
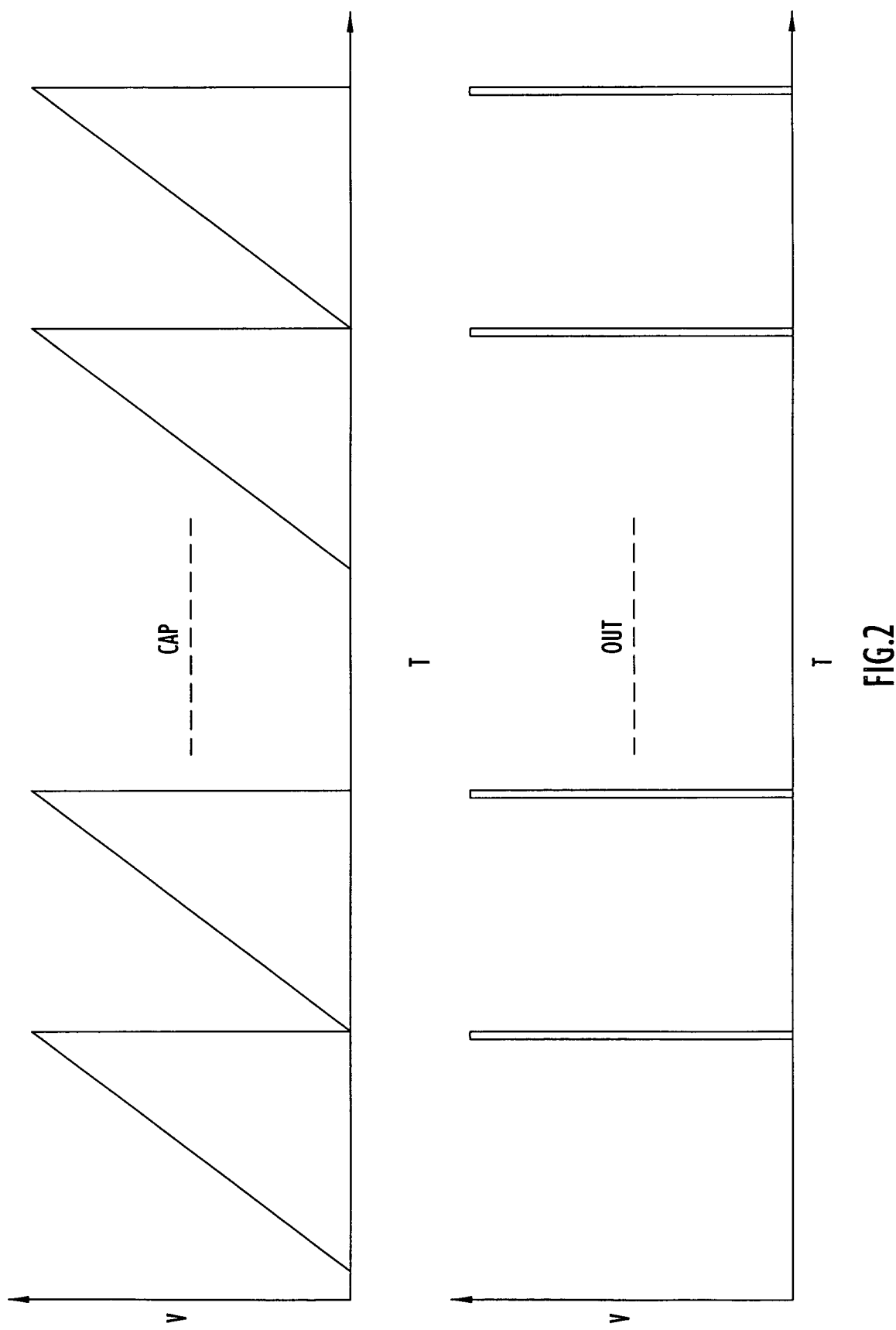
FIG. 2 is graphical illustrations of timing diagrams of capacitor voltage and an oscillator output pulse of the oscillator of FIG. 1.

Since the high level output signal is maintained during charging of capacitor 85 to the threshold voltage, the time interval to transfer charge between capacitors 80 and 85 controls the pulsewidth of the oscillator output pulse. This time interval may be set to any interval to produce a desired pulsewidth and depends upon the characteristics of capacitors 80, 85 and the dimensions of the n-channel of NFET 114 (e.g., $N_{dis}$ as viewed in FIG. 3). By way of example only, NFET 114 may include an n-channel length of 2.2. microns and an n-channel width of 2.0 microns, capacitors 80, 85 may respectively include gate area ratios of 28/16 and 20/16, current source 75 may provide approximately 5 μamps of current and the reference voltage may provide approximately 1.1 volts. This exemplary configuration produces an oscillator period of approximately 500 nanosec. and increases the pulsewidth to approximately 90% of the oscillator period (e.g., 450 nanosec.), as compared with a pulsewidth of approximately 1% of the period (e.g., 5 nanosec.) of the conventional oscillator described above for FIG. 1. Accordingly, current source 75 is disabled for a majority of the time the oscillator is operating, thereby eliminating most of the current loss from the current source and significantly reducing oscillator power consumption.

Once capacitor 85 charges and toggles latch 105 to produce a low level output signal, the low level signal traverses the feedback path and enables current source 75. The low level signal further disables NFET 114 to permit capacitor 80 to charge for a subsequent cycle. Inverter 112 inverts the low level feedback signal to produce a high level signal to enable NFET 116, thereby discharging capacitor 85 as illustrated in FIG. 4. The voltage of capacitor 85 drops below the threshold voltage of inverter 120 during discharge (FIG. 4), thereby enabling inverter 120 to provide a high level signal to latch input 108 (of NAND gate 109). Latch input 102 (of NAND gate 107) receives the high level signal from differential amplifier 90 since the voltage of capacitor 80 is below the reference voltage. Thus, the circuit is basically reset and provides high level signals to respective latch inputs 102, 108 to maintain the low level oscillator output until capacitor 80 charges to at least the reference voltage as described above. The above process is repeated for subsequent cycles to produce the oscillator output pulses.

It will be appreciated that the embodiments described above and illustrated in the drawings represent only a few of the many ways of implementing an apparatus and method for reducing power consumption within an oscillator.

The oscillator of the present invention may provide pulses at any desired period, where the pulsewidths may occupy any desired portion of the oscillator period to reduce power consumption. The oscillator components (e.g., transistors, capacitors, latch, amplifier, inverter, etc.) may be implemented by any quantity of any conventional or other electrical components (e.g., capacitors, transistors, gates, amplifiers, inverters, current sources, etc.) arranged in any fashion to control the pulsewidth of the output pulse. The oscillator components may include any desired characteristics (e.g., capacitances, threshold voltages, etc.).

The current source of the present invention oscillator may be implemented by any quantity of any conventional or other current sources (e.g., transistors, etc.) and provide any desired quantity of current. The oscillator may alternatively utilize voltage sources and inductive devices in place of the current source and capacitor combination in the manner described above to reduce power consumption. The current source may include or be coupled to any suitable control device (e.g., switch, regulator, etc.) to enable and/or disable the current source. The current source may be enabled or disabled based on any types of signals (e.g., enabled in response to a low level or high level signal, disabled in response to a low level or high level signal, etc.).

The differential amplifier of the present invention oscillator may be implemented by any quantity of any conventional or other devices providing a comparison or difference signal (e.g., differential amplifier, comparator, logic, etc.) and may include any quantity of inputs and outputs. The differential amplifier may include any conventional configuration to provide the difference signal (e.g., any types of transistors (e.g., FET (N or P type), BJT, MOSFET, etc.), etc.). The reference voltage may be implemented by any quantity of any conventional or other voltage sources and may provide any desired voltage level. The differential amplifier may receive any signals on any inputs, where the oscillator may be configured to accommodate the differential amplifier output. For example, the capacitor and reference voltages may swap inputs, where the oscillator handles a high level signal from the differential amplifier in response to charging of the capacitor.

The latch of the present invention oscillator may be implemented by any quantity of any type of conventional or other latches or storage units (e.g., registers, flip-flops (e.g., RS, JK, D, toggle or other types of flip-flops), buffers, etc.). The latch may include any quantity of any types of logic gates (e.g., NAND, AND, OR, NOR, XOR, etc.) arranged in any desired fashion. The latch may enter states or provide a specified output based on any desired signal levels (e.g., the latch may enter states or provide a specified output based on high or low level signals, etc.). The latch may be configured to enter states or provide a specified output in accordance with any desired logic or combination of any quantity of input signals (e.g., follow any desired truth or logic table, etc.).

The various transistors (e.g., PFETs, NFETs, etc.) of the present invention oscillator may be implemented by any quantity of any conventional or other transistors (e.g., FETS, BJTs, etc.) including any desired characteristics (e.g., channel widths, dimensions, threshold values, operating regions, etc.). The oscillator of the present invention may be configured to operate as described above with transistors providing opposing polarity (e.g., PFETs may be replaced by NFETs, NFETs may be replaced by PFETs or any combinations thereof, etc.). The inverters of the present invention oscillator may be implemented by any quantity of any conventional or other inverting devices (e.g., inverters, transistors, logic, etc.) including any desired characteristics (e.g., threshold values, etc.). The inverters may include any quantity of any types of suitable electrical components (e.g., diodes, transistors (e.g., FET (N or P types), BJT, etc.) and have any desired threshold voltages.

The capacitors of the present invention oscillator may be of any quantity, may be arranged in the oscillator circuit in any fashion and may be implemented by any types of conventional or other capacitive or energy storage devices. The capacitors may include any desired characteristics (e.g., capacitances, gate area ratios, etc.) to provide the desired pulsewidth. The transistor controlling the transfer of charge (e.g., NFET 114) may be implemented by any quantity of any type of conventional or other transistor (e.g., PFET, NFET, BJT, etc.). The transistor may include any desired characteristics (e.g., N or P channel length and width, threshold voltages, operating ranges, etc.) to control the transfer of charge and the pulsewidth. The various signals of the oscillator of the present invention may include any desired voltage levels, where high level signals may include any desired voltage ranges sufficient to be recognized as a high logic level signal for an application. Similarly, low level signals may include any desired voltage ranges sufficient to be recognized as a low logic level for an application. Further, the oscillator may be configured to utilize any desired logic or logic levels for the various oscillator signals (e.g., latch inputs, differential amplifier output, feedback signal for current source and other control, etc.). The oscillator of the present invention may be configured to lengthen or shorten the high or low level portions of the output pulse to reduce power consumption depending upon a particular application (e.g., depending upon the types of signals used to control the current or other power source). The oscillator circuit may include any type of power source (e.g., current source, voltage source, etc.) and may adjust the output pulse in any fashion to control the amount of time the power source is active in order to reduce power consumption.

The present invention is not limited to the applications described above, but may be applied to any types of circuits generating a waveform to control the time interval a power source is active in order to reduce power consumption. The oscillator circuit of the present invention may be modified in any desired fashion to adjust the pulsewidth of an output pulse of a circuit (e.g., lengthen or shorten the high or low level portions of the pulse) to control power consumption as described above.

From the foregoing description, it will be appreciated that the invention makes available a novel apparatus and method for reducing power consumption within an oscillator, wherein an oscillator includes circuitry to increase the pulsewidth of an oscillator output pulse to lengthen the time interval an oscillator current source maintains a disabled state, thereby reducing oscillator power consumption.

Having described preferred embodiments of a new and improved apparatus and method for reducing power consumption within an oscillator, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A method of reducing power consumption within a signal generator generating an output pulse at a predetermined period, wherein said output pulse controls a signal generator power source, said method comprising:
   (a) adjusting a pulsewidth of the signal generator output pulse to increase the time interval within said predetermined period that said power source is in a disabled state, thereby reducing power consumption of said signal generator;
   wherein said signal generator includes a latch to produce a state of said output pulse and first and second capacitive devices, and step (a) further includes:
      (a.1) triggering said latch in response to said first capacitive device charging to a first reference level to produce and maintain said output pulse in a first state during said time interval, wherein said first state disables said power source; and
      (a.2) triggering said latch after said time interval to produce and maintain said output pulse in a second state, wherein said second state enables said power source and step (a.2) further includes:
         (a.2.1) transferring charge from said first capacitive device to said second capacitive device to charge said second capacitive device and triggering said latch in response to said second capacitive device charging to a second reference level.

2. The method of claim 1, wherein said signal generator includes a switching device coupling said first and second capacitive devices, and step (a.2.1) further includes:
   (a.2.1.1) controlling transfer of charge from said first capacitive device to said second capacitive device via said switching device.

3. A method of reducing power consumption within an oscillator generating an output pulse at a predetermined period, wherein said output pulse controls an oscillator power source, said method comprising:
   (a) adjusting a pulsewidth of the oscillator output pulse to increase the time interval within said predetermined period that said power source is in a disabled state, thereby reducing power consumption of said oscillator, wherein said oscillator includes a first capacitive device to control transition of said output pulse to a first state disabling said power source and a second capacitive device controlling transition of said output pulse to a second state enabling said power source, and step (a) further includes:
      (a.1) transferring charge from said first capacitive device to said second capacitive device and transitioning said output pulse from said first state to said second state in response to said second capacitive device charging to a reference level.

4. A signal generator with reduced power consumption comprising:
   a power source;
   a signal generation unit to produce an output signal at a predetermined period, wherein said output signal controls said power source; and
   an adjustment unit to adjust a pulsewidth of the output signal to increase the time interval within said predetermined period that said power source is in a disabled state, thereby reducing power consumption of said signal generator, wherein said adjustment unit includes:
      a latch to produce and maintain a state of said output signal, wherein said latch produces and maintains said output pulse in a first state disabling said power source during said time interval in response to a first triggering event, and produces and maintains said output pulse in a second state enabling said power source in response to a second triggering event occurring at termination of said time interval;
      a first capacitive device coupled to said power source, wherein said first triggering event corresponds to said first capacitive device charging to a first reference level;
      a second capacitive device; and
      a switching device coupled between said first and second capacitive devices to control transfer of charge from said first capacitive device to said second capacitive device to charge said second capacitive device, wherein said second triggering event corresponds to said second capacitive device charging to a second reference level.

5. The signal generator of claim 4, wherein said signal generation unit includes:
   a differential amplifier coupled to said first capacitive device and to a power supply providing a signal at said first reference level, wherein said differential amplifier produces a signal to control said latch to produce said output signal in said first state in response to said first capacitive device charging to said first reference level.

6. The signal generator of claim 4, wherein said switching device includes a transistor and said first and second capacitive devices include capacitors, and said time interval is based on channel dimensions of said transistor and capacitances of said capacitors.

7. An oscillator with reduced power consumption comprising:
a power source;
a signal generation unit to produce an output signal at a predetermined period,
wherein said output signal controls said power source; and
an adjustment unit to adjust a pulsewidth of the output signal to increase the time interval within said predetermined period that said power source is in a disabled state, thereby reducing power consumption of said oscillator, wherein said adjustment unit includes a first capacitive device to control transition of said output pulse to a first state disabling said power source and a second capacitive device controlling transition of said output pulse to a second state enabling said power source, and wherein charge is transferred from said first capacitive device to said second capacitive device and said output pulse transitions from said first state to said second state in response to said second capacitive device charging to a reference level.

8. A signal generator with reduced power consumption comprising:
power means for providing power for said signal generator;
signal generation means for producing an output signal at a predetermined period, wherein said output signal controls said power means; and
adjustment means for adjusting a pulsewidth of the output signal to increase the time interval within said predetermined period that said power means is in a disabled state, thereby reducing power consumption of said signal generator, wherein said adjustment means includes:
latch means for producing and maintaining a state of said output signal, wherein said latch means produces and maintains said output pulse in a first state disabling said power means during said time interval in response to a first triggering event, and produces and maintains said output pulse in a second state enabling said power means in response to a second triggering event occurring at termination of said time interval;
first capacitive means coupled to said power means for accumulating charge, wherein said first triggering event corresponds to said first capacitive means charging to a first reference level;
second capacitive means for accumulating charge; and
switching means coupled between said first and second capacitive means to control transfer of charge from said first capacitive means to said second capacitive means to charge said second capacitive means, wherein said second triggering event corresponds to said second capacitive means charging to a second reference level.

9. The signal generator of claim 8, wherein said signal generation means includes:
amplifier means coupled to said first capacitive means and to a power supply providing a signal at said first reference level, wherein said amplifier means produces a signal to control said latch means to produce said output signal in said first state in response to said first capacitive means charging to said first reference level.

10. The signal generator of claim 8, wherein said switching means includes a transistor and said first and second capacitive means include capacitors, and said time interval is based on channel dimensions of said transistor and capacitances of said capacitors.

11. An oscillator with reduced power consumption comprising:
power means for providing power for said oscillator;
signal generation means for producing an output signal at a predetermined period,
wherein said output signal controls said power means; and
adjustment means for adjusting a pulsewidth of the output signal to increase the time interval within said predetermined period that said power means is in a disabled state, thereby reducing power consumption of said oscillator, wherein said adjustment means includes first capacitive means for controlling transition of said output pulse to a first state disabling said power means and second capacitive means for controlling transition of said output pulse to a second state enabling said power means, and wherein charge is transferred from said first capacitive means to said second capacitive means and said output pulse transitions from said first state to said second state in response to said second capacitive means charging to a reference level.

12. An oscillator with reduced power consumption to produce an output pulse at a predetermined period comprising:
a power source;
a first capacitive device coupled to said power source;
a differential amplifier coupled to said first capacitive device and to a power supply providing a signal at a first reference level;
a latch to produce and maintain said oscillator output pulse in a first state disabling said power source in response to a first triggering event, and to produce and maintain said oscillator output pulse in a second state enabling said power source in response to a second triggering event, wherein said first triggering event corresponds to said first capacitive device charging to said first reference level to enable said differential amplifier to produce a signal to trigger said latch;
a switching device coupled between said first and second capacitive devices to control transfer of charge from said first capacitive device to said second capacitive device to charge said second capacitive device, wherein charging of said second capacitive device to a second reference level corresponds to said second triggering event and adjusts a pulsewidth of the output pulse to increase the time interval within said predetermined period that said power source is in a disabled state, thereby reducing power consumption of said oscillator.

13. The oscillator of claim 12, wherein said switching device includes a transistor and said first and second capacitive devices include capacitors, and said time interval is based on channel dimensions of said transistor and capacitances of said capacitors.

14. A method of reducing power consumption within a signal generator, said signal generator comprising a current source, a first capacitor coupled to said current source for accumulating charge, a latch for producing and maintaining a state of an output signal, and a second capacitor, wherein the current source is controllable by the output signal via a feedback path so as to be disabled in case of the output signal being in said first state, and to be enabled in case of the output signal being in said second state, said method comprising:

triggering said latch to produce and maintain said output signal in the first state in response to said first capacitor charging to a first reference level;

transferring charge from said first capacitor to said second capacitor to charge said second capacitor in response to said first capacitor charging to a first reference level; and triggering said latch to produce and maintain said output signal in the second state in response to said second capacitor charging to a second reference level.

15. A signal generator with reduced power consumption comprising:

a current source;

a first capacitor coupled to said current source for accumulating charge;

an amplifier coupled to said first capacitor for producing a latch control signal indicating a first triggering event in response to said first capacitor charging to a first reference level;

a latch for producing and maintaining a state of an output signal, wherein said latch is configured to produce and maintain said output signal in a first state in response to the latch control signal, and produce and maintain said output pulse in a second state in response to a second triggering event, wherein the current source is controllable by the output signal via a feedback path so as to be disabled in case of the output signal being in said first state, and to be enabled in case of the output signal being in said second state;

a second capacitor; and a switch coupled between said first and second capacitors and being configured to, upon the output signal being in the first state, transfer charge from said first capacitor to said second capacitor to charge said second capacitor, wherein said second triggering event corresponds to said second capacitor charging to a second reference level.

* * * * *